United States Patent
Hida

(10) Patent No.: US 10,761,144 B2
(45) Date of Patent: Sep. 1, 2020

(54) ELECTRONIC DEVICE

(71) Applicant: HITACHI AUTOMOTIVE SYSTEMS, LTD., Hitachinaka-shi, Ibaraki (JP)

(72) Inventor: Shinichirou Hida, Hitachinaka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 162 days.

(21) Appl. No.: 16/063,809

(22) PCT Filed: Nov. 16, 2016

(86) PCT No.: PCT/JP2016/083878
§ 371 (c)(1),
(2) Date: Jun. 19, 2018

(87) PCT Pub. No.: WO2017/110312
PCT Pub. Date: Jun. 29, 2017

(65) Prior Publication Data
US 2020/0088808 A1    Mar. 19, 2020

(30) Foreign Application Priority Data

Dec. 25, 2015 (JP) ................... 2015-252813

(51) Int. Cl.
*G01R 31/40* (2020.01)
(52) U.S. Cl.
CPC ................... *G01R 31/40* (2013.01)
(58) Field of Classification Search
CPC ........................................ G01R 31/40

USPC .................................................. 324/764.01
See application file for complete search history.

(56) References Cited

FOREIGN PATENT DOCUMENTS

| JP | H01-223360 A | 9/1989 |
|----|--------------|--------|
| JP | 2002-267696 A | 9/2002 |
| JP | 2012-169715 A | 9/2012 |
| JP | 2014-117084 A | 6/2014 |

(Continued)

OTHER PUBLICATIONS

Translation of Kimura et al.; Japanese Patent Document JP 2002267696 A1; Pub. Date Sep. 18, 2002 (Year: 2002).*

(Continued)

*Primary Examiner* — Melissa J Koval
*Assistant Examiner* — Rahul Maini
(74) *Attorney, Agent, or Firm* — Foley & Lardner LLP

(57) ABSTRACT

The number of ports of a microcomputer is increased to detect an abnormality of the power supply line in a case where a power supply line to a load circuit is increased in number by two or more systems. A first resistor R1 and a second resistor R2 are commonly connected to one end of a third resistor R3. The other end of the third resistor R3 is connected to a monitor port of the microcomputer 15 and is grounded through a fourth resistor R4. The microcomputer 15 determines a value of a monitor voltage input to the monitor port to determine an abnormality of a first power supply line L1 and a second power supply line L2. Specifically, it is determined whether the first power supply line L1 and the second power supply line L2 are short-circuited to a ground side, or a voltage is not supplied to the first power supply line L1 and the second power supply line L2 due to an open circuit.

3 Claims, 7 Drawing Sheets

(56) References Cited

FOREIGN PATENT DOCUMENTS

JP 2015-222228 A 12/2015

OTHER PUBLICATIONS

International Search Report with English translation and Written Opinion issued in corresponding application No. PCT/JP2016/083878 dated Feb. 7, 2017.

* cited by examiner

FIG. 3

|    | typ      | min     | max      |
|----|----------|---------|----------|
| V1 | 5.0V     | 4.9V    | 5.1V     |
| V2 | 5.0V     | 4.9V    | 5.1V     |
| R1 | 100.0kΩ  | 98.0kΩ  | 102.0kΩ  |
| R2 | 51.0kΩ   | 50.0kΩ  | 52.0kΩ   |
| R3 | 15.0kΩ   | 14.7kΩ  | 15.3kΩ   |
| R4 | 200.0kΩ  | 196.0kΩ | 204.0kΩ  |

ELECTRONIC DEVICE

TECHNICAL FIELD

The present invention relates to an electronic device.

BACKGROUND ART

There is an electronic device which supplies power to a load circuit by a power supply circuit to drive the load circuit. The load circuit is, for example, a sensor. In such an electronic device, a detection of an abnormality such as a short circuit of a power supply line connecting the power supply circuit and the load circuit is performed. In PTL 1, a voltage of the power supply line is divided, and input to a port of a microcomputer as a monitor voltage to monitor the voltage by the microcomputer, so that the short circuit of the power supply line is determined.

CITATION LIST

Patent Literature

PTL 1: JP 2014-117084 A

SUMMARY OF INVENTION

Technical Problem

There has been a problem that, in a case where a power supply line connecting a power supply circuit and a load circuit is increased in number by two or more systems, the number of ports of a microcomputer is increased to detect an abnormality of the power supply lines.

Solution to Problem

An electronic device according to the present invention includes: a first power supply circuit which supplies power to a first load circuit through a first power supply line; a second power supply circuit which supplies power to a second load circuit through a second power supply line; a first resistor of which one end is connected to the first power supply line; a second resistor of which one end is connected to the second power supply line; a third resistor which is connected to the other ends of the first and second resistors; and a monitor circuit which receives a monitor voltage through the third resistor, in which the monitor circuit determines an abnormality of the first power supply line and the second power supply line on the basis of the voltage.

Advantageous Effects of Invention

According to the present invention, even in a case where a power supply line connecting a power supply circuit and a load circuit is increased in number by a plurality of systems, there is no need to increase the number of ports of a microcomputer.

BRIEF DESCRIPTION OF DRAWINGS

FIG. 3 is a diagram illustrating an example of a constant of the equivalent circuit according to the first embodiment.

DESCRIPTION OF EMBODIMENTS

First Embodiment

Figure 1:
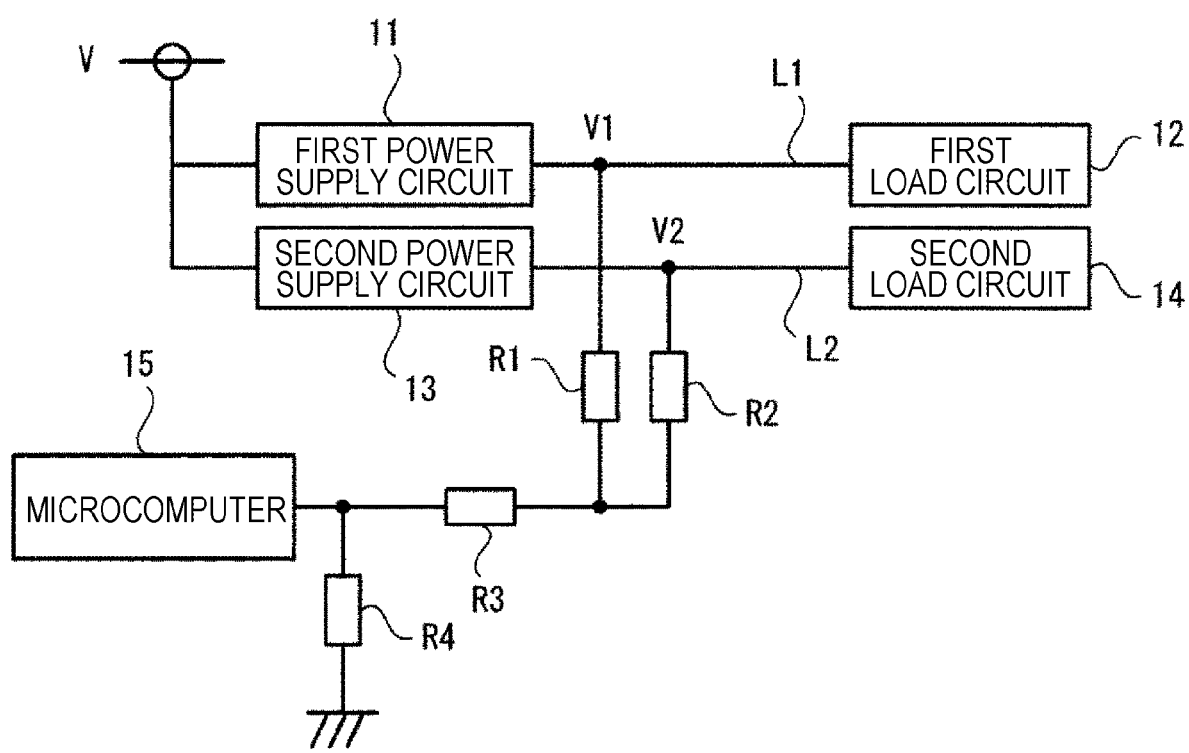
FIG. 1 is a circuit diagram of an electronic device according to a first embodiment.

FIG. 1 is a circuit diagram of an electronic device according to a first embodiment.

A first power supply circuit 11 is supplied with a voltage V as a power source, and outputs a voltage V1 on the basis of the voltage V. The voltage V1 is supplied to a first load circuit 12 through a first power supply line L1 as a power source of the first load circuit 12. Examples of the first load circuit 12 include a sensor and a DC fan.

A second power supply circuit 13 is supplied with the voltage V as a power source, and outputs a voltage V2 on the basis of the voltage V. The voltage V2 is supplied to a second load circuit 14 through a second power supply line L2 as a power source of the second load circuit 14. Examples of the second load circuit 14 include a sensor and a DC fan.

One end of a first resistor R1 is connected to the first power supply line L1, and one end of a second resistor R2 is connected to the second power supply line L2. The other end of the first resistor R1 and the other end of the second resistor R2 are commonly connected to one end of a third resistor R3. The other end of the third resistor R3 is input to a monitor port of a microcomputer 15, and is grounded through a fourth resistor R4. The microcomputer 15 determines a value of a monitor voltage input to the monitor port to determine an abnormality of the first power supply line L1 and the second power supply line L2. Specifically, the microcomputer determines whether the first power supply line L1 and the second power supply line L2 are short-circuited to a ground side (hereinafter, referred to as "short") or a voltage is not output to the first power supply line L1 and the second power supply line L2 due to an open circuit (hereinafter, referred to as "open") or the like.

Here, the description will be given about a relation among resistance values of the first to fourth resistors R1 to R4. The resistance values of the first to fourth resistors R1 to R4 are set to R1 to R4. Next, as shown Formula (1) or (2), a ratio of the resistance value of the first resistor R1 and the resistance value of the second resistor R2 is about two times. Further, as shown in Formula (3), the resistance value of the fourth resistor R4 is about four times a combined resistance value of the first resistor R1, the second resistor R2, and the third resistor R3. About two times and four times may be resistance values causing voltages that enables identification of features 41 to 45 of FIG. 4 to be described below.

[Mathematical Formula 1]

$$\frac{R1}{R2} \fallingdotseq 2 \qquad (1)$$

-continued $$\frac{R2}{R1} \fallingdotseq 2 \qquad (2)$$

$$R4 \fallingdotseq 4 \times \left(\frac{R1 \times R2}{R1 + R2} + R3\right) \qquad (3)$$

FIG. 2 is a diagram illustrating equivalent circuits of a circuit configuration illustrated in FIG. 1. FIG. 2(A) illustrates an equivalent circuit in the case of a normal state where there is no short or open in the first power supply line L1 and the second power supply line L2. FIG. 2(B) illustrates an equivalent circuit in a case where the first power supply line L1 is opened. FIG. 2(C) illustrates an equivalent circuit in a case where the second power supply line L2 is opened. FIG. 2(D) illustrates an equivalent circuit in a case where the first power supply line L1 is shorted. FIG. 2(E) illustrates an equivalent circuit in a case where the second power supply line L2 is shorted. Here, the values of the voltages V1 and V2 are set to V1 and V2, the resistance values of the first to fourth resistors R1 to R4 are set to R1 to R4, and the currents flowing to the first to third resistors R1 to R3 are respectively set to Ia, Ib, and Ic. In addition, "X" depicted in FIGS. 2(B) and 2(C) indicates an open circuit.

FIG. 3 is a diagram illustrating an example of constants of the equivalent circuit. Typical values (typ), minimum values (min), and maximum values (max) of the values of the voltages V1 and V2 and the resistance values of the first to fourth resistors R1 to R4 are listed. Here, the first resistor R1 has a resistance value sufficiently larger than the internal resistance of the first load circuit 12. The second resistor R2 has a resistance value sufficiently larger than the internal resistance of the second load circuit 14. In addition, the current flowing to the first power supply line L1 and the second power supply line L2 is set to about 20 mA.

Figure 2A:
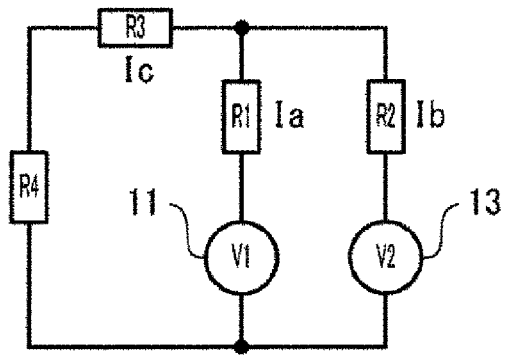
FIGS. 2(A), 2(B), 2(C), 2(D), and 2(E) are equivalent circuits of the electronic device according to the first embodiment.
Figure 2B:
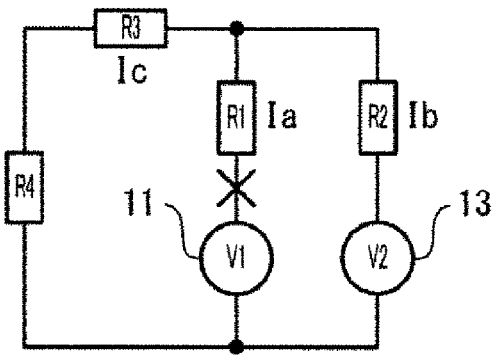
Figure 2C:
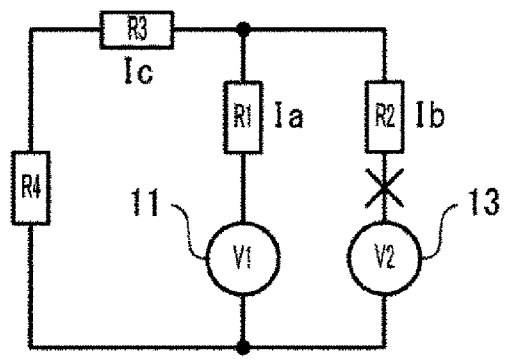
Figure 2D:
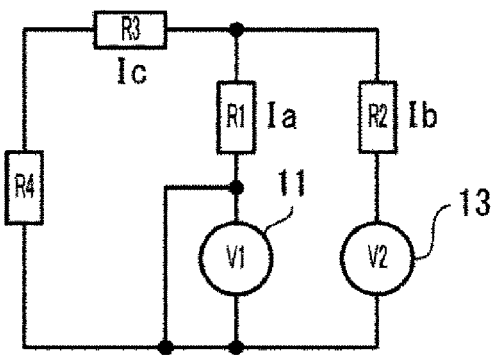
Figure 2E:
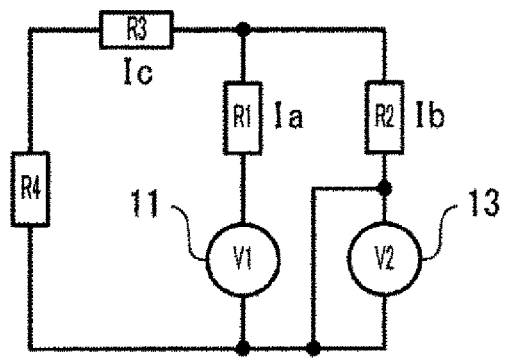
Figure 4:
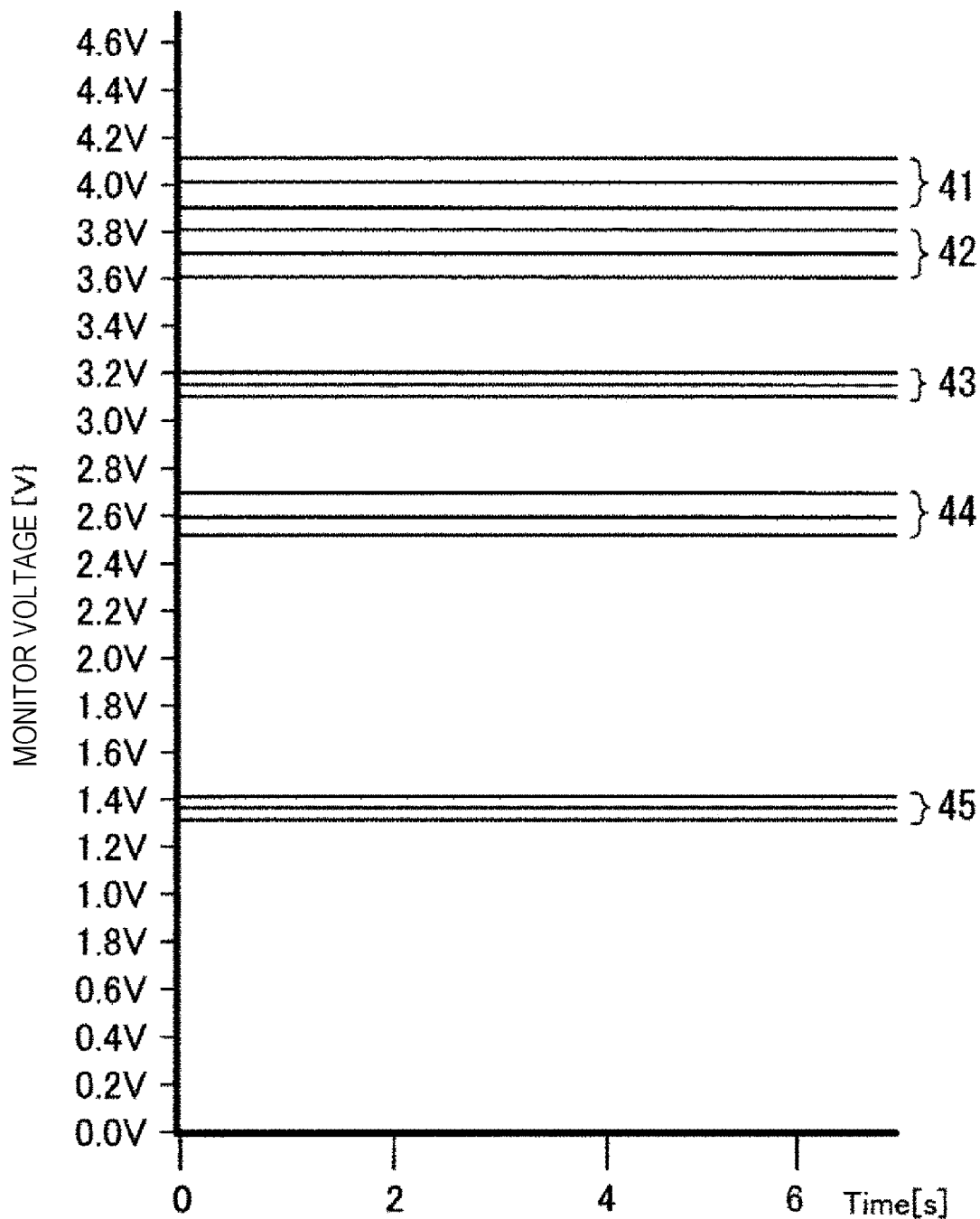
FIG. 4 is a graph illustrating a monitor voltage according to the first embodiment.

FIG. 4 is a graph illustrating a monitor voltage input to the monitor port of the microcomputer 15. A vertical axis of FIG. 4 represents the monitor voltage, and a horizontal axis represents time. In the case of the normal state where there is no short or open in the equivalent circuit of FIG. 2(A), the feature 41 of the monitor voltage is about 3.9 to 4.1 V. In a case where the first power supply line L1 illustrated in the equivalent circuit of FIG. 2(B) is opened, the feature 42 of the monitor voltage is about 3.6 to 3.8 V. In a case where the second power supply line L2 illustrated in the equivalent circuit of FIG. 2(C) is opened, the feature 43 of the monitor voltage is about 3.1 to 3.2 V. In a case where the first power supply line L1 illustrated in the equivalent circuit of FIG. 2(D) is shorted, the feature 44 of the monitor voltage is about 2.5 to 2.7 V. In a case where the second power supply line L2 illustrated in the equivalent circuit of FIG. 2(E) is shorted, the feature 45 of the monitor voltage is about 1.3 to 1.4 V. The microcomputer 15 determines an abnormality of the first power supply line L1 and the second power supply line L2 on the basis of the monitor voltage input to the monitor port. Specifically, the abnormality is determined according to the features 41 to 45 to which the monitor voltage belongs.

Next, the description below will be given about a case where the monitor voltage corresponds to the features illustrated in FIG. 4 according to an abnormality.

First, the description will be given about the case of the normal state where there is no short or open illustrated in the equivalent circuit of FIG. 2(A). The following Formulas (4) to (6) are satisfied from the equivalent circuit of FIG. 2(A).

$$Ia = Ic - Ib \qquad (4)$$

$$V1 = (R3+R4) \times Ic + R1 \times Ia \qquad (5)$$

$$V2 = (R3+R4) \times Ic + R2 \times Ib \qquad (6)$$

Formula (4) is substituted in Formula (5).

$$V1 = (R3+R4+R1) \times Ic - R1 \times Ib \qquad (7)$$

Both sides of Formula (6) are multiplied by R1, and both sides of Formula (7) are multiplied by R2, and left sides and right sides of both formulas are respectively added so as to obtain the following Formula (8).

[Mathematical Formula 2]

$$Ic = \frac{V1R2 + V2R1}{R1R2 + R1R3 + R1R4 + R2R3 + R2R4} \qquad (8)$$

The monitor voltage is represented by the following Formula (9).

$$\text{Monitor voltage} = R4 \times Ic \qquad (9)$$

When the constants shown in FIG. 3 are input to Formulas (8) and (9) to obtain the monitor voltage, the typical value (typ) becomes 4.02 V, the minimum value (min) becomes 3.94 V, and the maximum value (max) becomes 4.10 V. The monitor voltage is a voltage indicated by the feature 41 of FIG. 4.

In addition, the monitor voltage in a case where the first power supply line L1 illustrated in the equivalent circuit of FIG. 2(B) is opened is represented by the following Formula (10).

[Mathematical Formula 3]

$$\text{Monitor Voltage} = V2 \times \frac{R4}{R4 + R3 + R2} \qquad (10)$$

In addition, the monitor voltage in a case where the second power supply line L2 illustrated in the equivalent circuit of FIG. 2(C) is opened is represented by the following Formula (11).

[Mathematical Formula 4]

$$\text{Monitor Voltage} = V1 \times \frac{R4}{R4 + R3 + R1} \qquad (11)$$

In addition, the monitor voltage in a case where the first power supply line L1 illustrated in the equivalent circuit of FIG. 2(D) is shorted is represented by the following Formula (12).

[Mathematical Formula 5]

$$\text{Monitor Voltage} = V2 \times \left[\frac{\frac{(R4+R3) \times R1}{R4+R3+R2}}{\frac{(R4+R3) \times R2}{R4+R3+R2} + R1}\right] \times \frac{R4}{R4+R3} \qquad (12)$$

In addition, the monitor voltage in a case where the second power supply line L2 illustrated in the equivalent circuit of FIG. 2(E) is shorted is represented by the following Formula (13).

[Mathematical Formula 6]

$$\text{Monitor Voltage} = V1 \times \left[ \frac{\frac{(R4+R3) \times R2}{R4+R3+R2}}{\frac{(R4+R3) \times R2}{R4+R3+R2} + R1} \right] \times \frac{R4}{R4+R3} \quad (13)$$

When the constants shown in FIG. 3 are input to Formulas (10) to (13) to calculate the monitor voltage, the voltages indicated by the features 42 to 45 of FIG. 4 are obtained.

According to the first embodiment of the present invention, even in a case where the power supply line connecting the power supply circuit and the load circuit is increased in number by a plurality of systems, it is possible to detect an abnormality of the first power supply line L1 and the second power supply line L2 without increasing the number of ports of the microcomputer.

Second Embodiment

Figure 5:
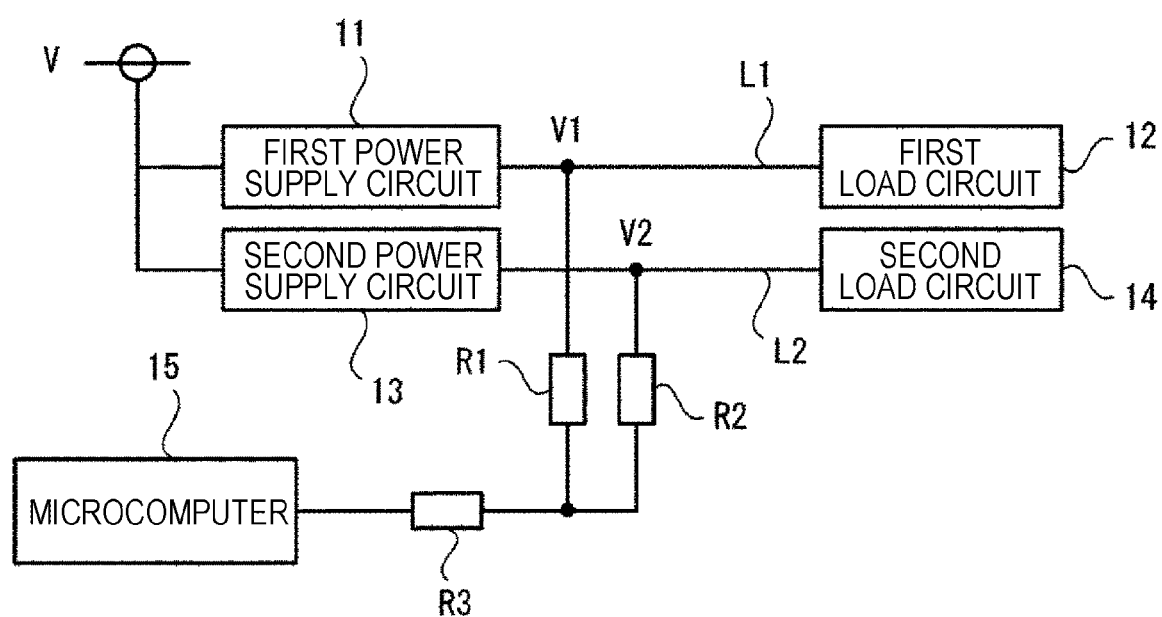
FIG. 5 is a circuit diagram of an electronic device according to a second embodiment.

Next, a second embodiment of the electronic device of the present invention will be described. FIG. 5 is a circuit diagram of the electronic device according to the second embodiment. From the circuit diagram of the second embodiment, the fourth resistor R4 of the circuit diagram illustrated in FIG. 1 is removed. The same parts as those of the circuit diagram of FIG. 1 will be attached with the same symbols, and the description will be omitted.

As illustrated in FIG. 5, one end of the first resistor R1 is connected to the first power supply line L1, and one end of the second resistor R2 is connected to the second power supply line L2. The other end of the first resistor R1 and the other end of the second resistor R2 are commonly connected to one end of a third resistor R3. The other end of the third resistor R3 is input to the monitor port of the microcomputer 15. The microcomputer 15 determines a value of a monitor voltage input to the monitor port to determine an abnormality of the first power supply line L1 and the second power supply line L2. Specifically, the microcomputer detects whether the first power supply line L1 and the second power supply line L2 are short-circuited to a ground side (hereinafter, referred to as "short").

Here, the description will be given about a relation among resistance values of the first to fourth resistors R1 to R4. As shown in Formula (1) or (2), a ratio of the resistance value of the first resistor R1 and the resistance value of the second resistor R2 is about two times.

Figure 6A:
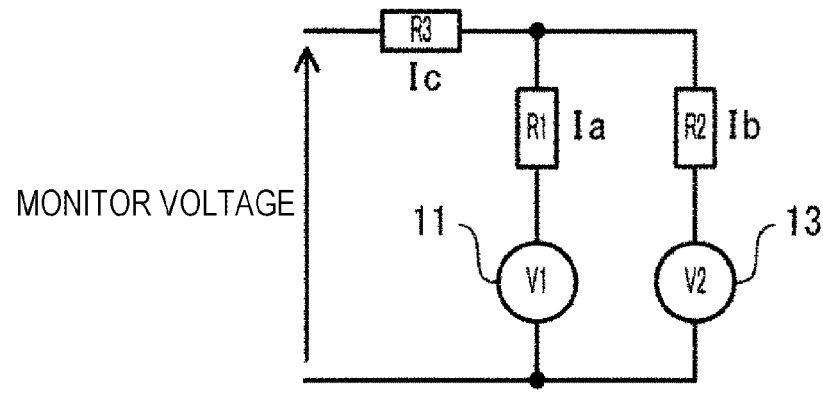
FIGS. 6(A), 6(B), and 6(C) are diagrams illustrating equivalent circuits of the electronic device according to the second embodiment.
Figure 6B:
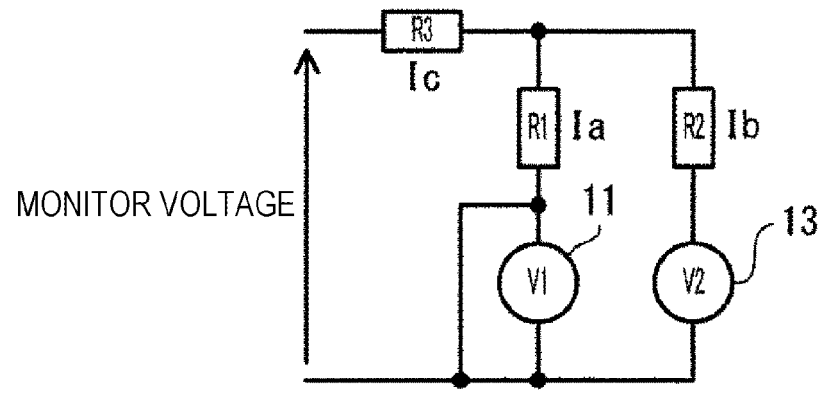
Figure 6C:
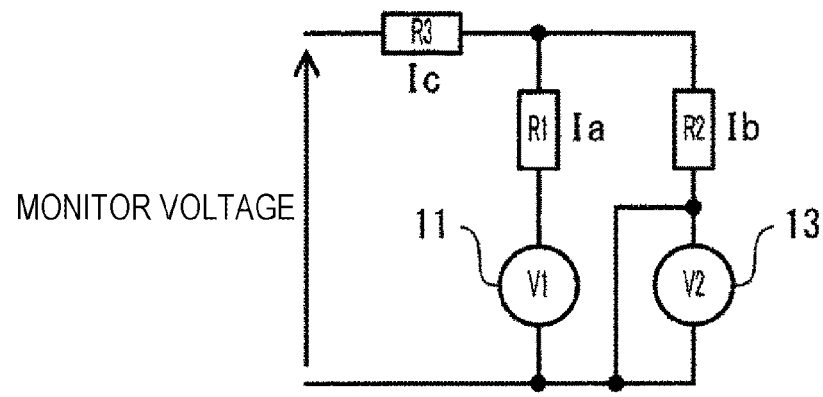

FIG. 6 is a diagram illustrating equivalent circuits of a circuit configuration illustrated in FIG. 5. FIG. 6(A) illustrates an equivalent circuit in the case of the normal state where there is no short. FIG. 6(B) illustrates an equivalent circuit in a case where the first power supply line L1 is shorted. FIG. 6(C) illustrates an equivalent circuit in a case where the second power supply line L2 is shorted. Here, the values of the voltages V1 and V2 are set to V1 and V2, the resistance values of the first to third resistors R1 to R3 are set to R1 to R3, and the currents flowing to the first to third resistors R1 to R3 are respectively set to Ia, Ib, and Ic.

The constants of the equivalent circuit illustrated in FIGS. 6(A) to (C) are considered as the same as those illustrated in FIG. 3. Note that the constants are given as an example. Here, the first resistor R1 has a resistance value sufficiently larger than the internal resistance of the first load circuit 12. The second resistor R2 has resistance value sufficiently larger than the internal resistance of the second load circuit 14. In addition, the current flowing to the first power supply line L1 and the second power supply line L2 is set to about 20 mA.

Figure 7:
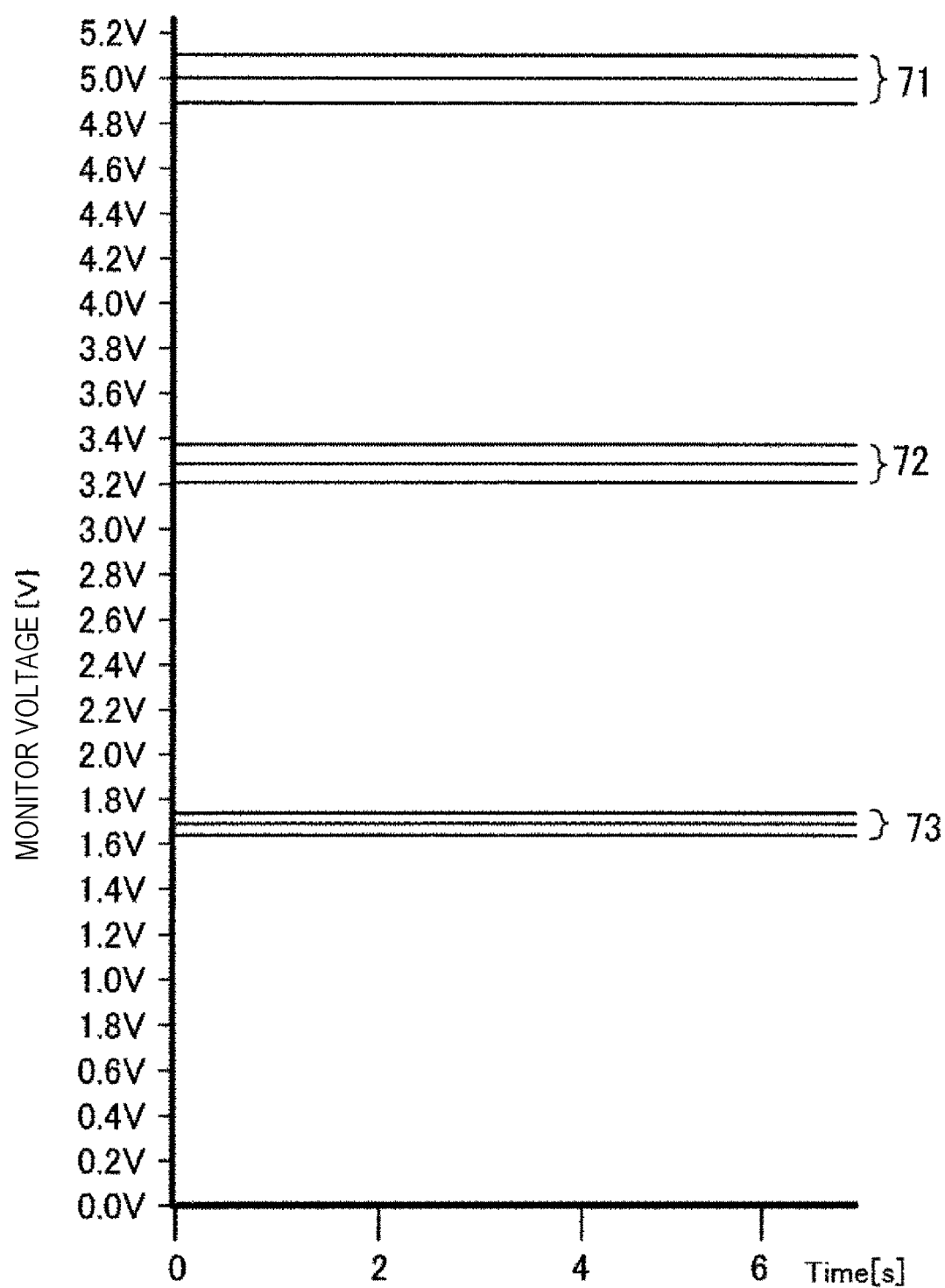
FIG. 7 is a graph illustrating a monitor voltage according to the second embodiment.

FIG. 7 is a graph illustrating the monitor voltage input to the monitor port of the microcomputer 15. A vertical axis of FIG. 7 represents the monitor voltage, and a horizontal axis represents time. In the case of the normal state where there is no short in the equivalent circuit of FIG. 6(A), a feature 71 of the monitor voltage is about 4.9 to 5.1 V. In a case where the first power supply line L1 illustrated in the equivalent circuit of FIG. 7(B) is shorted, a feature 72 of the monitor voltage is about 3.2 to 3.4 V. In a case where the second power supply line L2 illustrated in the equivalent circuit of FIG. 7(C) is shorted, a feature 73 of the monitor voltage is about 1.66 to 1.72 V. The microcomputer 15 determines an abnormality of the first power supply line L1 and the second power supply line L2 on the basis of the monitor voltage input to the monitor port. Specifically, the abnormality is determined according to the features 71 to 73 to which the monitor voltage belongs.

Next, the description below will be given about a case where the monitor voltage corresponds to the features illustrated in FIG. 7 according to an abnormality.

The monitor voltage in a case where the first power supply line L1 illustrated in the equivalent circuit of FIG. 6(B) is shorted is represented by the following Formula (14).

[Mathematical Formula 7]

$$\text{Monitor Voltage} = V2 \times \frac{R1}{R1 + R2} \quad (14)$$

In addition, the monitor voltage in a case where the second power supply line L2 illustrated in the equivalent circuit of FIG. 6(C) is shorted is represented by the following Formula (15).

[Mathematical Formula 8]

$$\text{Monitor Voltage} = V1 \times \frac{R2}{R1 + R2} \quad (15)$$

When the constants shown in FIG. 3 are input to Formulas (14) and (15) to calculate the monitor voltage, the voltages indicated by the features 72 and 73 of FIG. 7 are obtained. Note that, since Ia to Ic are significantly small, the voltage of the feature 71 of FIG. 7 is almost equal to the voltage V1 or V2.

According to the second embodiment of the present invention, even in a case where the power supply line connecting the power supply circuit and the load circuit is increased in number by a plurality of systems, it is possible to determine whether the abnormality of the first power supply line L1 and the second power supply line L2 is a short circuit without increasing the number of ports of the microcomputer.

According to the above-described embodiment, the following operational effect is obtained.

(1) An electronic device includes a first power supply circuit 11 which supplies power V1 to a first load circuit 12 through a first power supply line L1, a second power supply circuit 13 which supplies power V2 to a second load circuit 14 through a second power supply line L2, a first resistor R1 of which one end is connected to the first power supply line L1, a second resistor R2 of which one end is connected to the second power supply line L2, a third resistor R3 which is connected to the other ends of the first resistor R1 and the second resistor R2, and a monitor circuit (microcomputer) 15 which receives a monitor voltage through the third resistor R3. The monitor circuit 15 determines an abnormality of the first power supply line L1 and the second power supply line L2 on the basis of a voltage. With this configuration, even in a case where the power supply line connecting the power supply circuit and the load circuit is increased in number by a plurality of systems, there is no need to increase the number of ports of the microcomputer.

The present invention is not limited to the above embodiments, and other modifications considered to fall within a range of the technical ideas of the present invention may also be deemed to fall within the scope of the present invention as long as the features of the present invention is not impaired.

REFERENCE SIGNS LIST 11 first power supply circuit
12 first load circuit
13 second power supply circuit
14 second load circuit
L1 first power supply line
L2 second power supply line
R1 to R4 first to fourth resistors

The invention claimed is:

1. An electronic device, comprising:
   a first power supply circuit which supplies power to a first load circuit through a first power supply line;
   a second power supply circuit which supplies power to a second load circuit through a second power supply line;
   a first resistor of which one end is connected to the first power supply line;
   a second resistor of which one end is connected to the second power supply line;
   a third resistor which is connected to the other ends of the first and second resistors;
   a monitor circuit which receives a monitor voltage through the third resistor, and
   a fourth resistor of which one end is connected to a line connecting the third resistor and the monitor circuit, and the other end is grounded, wherein a ratio of the resistance value of the first resistor and the resistance value of the second resistor is about two times, and the resistance value of the fourth resistor is four times a combined resistance value of the first resistor, the second resistor, and the third resistor,
   wherein the monitor circuit determines an abnormality of the first power supply line and the second power supply line on the basis of the monitor voltage.

2. The electronic device according to claim 1, wherein the first resistor has a resistance value larger than an internal resistance of the first load circuit, and the second resistor has a resistance value larger than an internal resistance of the second load circuit.

3. The electronic device according to claim 1, wherein the monitor circuit determines whether the abnormality of the first power supply line and the second power supply line is a short circuit on the basis of the monitor voltage.

* * * * *